United States Patent

Priebe et al.

[11] Patent Number: 5,608,681
[45] Date of Patent: Mar. 4, 1997

[54] FAST MEMORY SENSE SYSTEM

[75] Inventors: Gordon W. Priebe, Champlin; Robin H. Passow, Maple Plain, both of Minn.

[73] Assignee: LSI Logic Corporation, Milpitas, Calif.

[21] Appl. No.: 589,531

[22] Filed: Jan. 22, 1996

[51] Int. Cl.$^6$ .............................. G11C 11/40; G11C 8/00
[52] U.S. Cl. .................. 365/207; 365/205; 365/203; 365/196; 365/189.11; 365/204
[58] Field of Search .................... 365/205, 189.01, 365/207, 233, 203, 196, 189.11, 204

[56] References Cited

U.S. PATENT DOCUMENTS

| | | | |
|---|---|---|---|
| 4,843,264 | 6/1989 | Galbraith | 307/530 |
| 4,980,799 | 12/1990 | Tobita | 361/311 |
| 5,013,943 | 5/1991 | Hirose | 307/530 |
| 5,068,830 | 11/1991 | Plants et al. | 365/190 |
| 5,117,394 | 5/1992 | Amin et al. | 365/203 |
| 5,193,076 | 3/1993 | Houston | 365/233.5 |
| 5,280,205 | 1/1994 | Green et al. | 307/530 |
| 5,305,272 | 4/1994 | Matsuo et al. | 365/208 |
| 5,317,218 | 5/1994 | Liu | 307/530 |
| 5,325,335 | 6/1994 | Ang et al. | 365/205 |
| 5,367,495 | 11/1994 | Ishikawa | 365/239 |
| 5,391,949 | 2/1995 | Vinal | 327/53 |
| 5,506,811 | 4/1996 | Mclaury | 365/233 |
| 5,526,314 | 6/1996 | Kumar | 365/207 |

FOREIGN PATENT DOCUMENTS

| | | | |
|---|---|---|---|
| 62-165797 | 7/1987 | Japan. | |
| 6-139769 | 5/1994 | Japan | 11/401 |

*Primary Examiner*—Viet Q. Nguyen
*Attorney, Agent, or Firm*—Katz & Cotton, LLP

[57] ABSTRACT

A fast memory system including one or more asymmetrical sense amplifiers precharged to a first logic state and optimized to slew very fast towards the first logic state. Each sense amplifier is coupled to a corresponding pair of complementary bit lines, which are preferably precharged. When enabled, each sense amplifier tends towards an opposite, default logic state opposite the first logic state when sensing the precharged bit lines. Control logic enables a corresponding precharge amplifier to precharge the bit lines, and then enables the sense amplifier after the assertion of a clock signal. Also, the control logic enables a corresponding pull-up device to precharge the output of each sense amplifier. Thus, the sense amplifier begins in the first, precharged logic state and slews towards the opposite, default logic state. The control logic then asserts a word line select signal to a corresponding memory cell, which drives a voltage differential on the bit lines to assert a data bit. If the data bit supports the default state, then the sense amplifier switches to the default state. However, if the data bit supports the first state, the sense amplifier quickly responds and slews back to the first state. In this manner, either logic state is achieved very quickly. Preferably, an invertor is coupled to the sense amplifier having an input switch-point set to favor the default logic state.

27 Claims, 4 Drawing Sheets

FAST MEMORY SENSE SYSTEM

BACKGROUND OF THE INVENTION

1. Technical Field of the Invention

The present invention relates to memory devices, and more particularly to a fast memory sense system for sensing data stored in a memory array.

2. Description of the Related Art

A memory array generally comprises a plurality of memory cells arranged in rows and columns, where each cell stores a corresponding data bit. Memory cells in each row are enabled by a corresponding word line signal asserted on a corresponding word line by an array of word line drivers. Usually, only one of the word line signals for the memory array is asserted at a time. An address is provided to a word line decoder which decodes the address and asserts one of the word line signals. Each column of memory cells is connected to a complementary pair of bit line signals. Thus, the enabled memory cell in each column drives a corresponding bit line and a complementary bit line forming the pair of complementary bit lines. A row of sense amplifiers typically runs along the bottom of the memory array, where each sense amplifier senses the enabled memory cell for accessing the corresponding data bit. A corresponding array of output latches are coupled to the array of sense amplifiers for latching the output data during a memory access.

Typical memory architectures enabled the sense amplifiers as soon as possible and were designed with the "low to high" and "high to low" access times as equal as possible. In this manner, each amplifier was symmetrical and optimized for equal slew in either direction to read either a low or a high bit. In some designs, the sense amplifiers were not enabled until after a known differential was asserted on the bit lines. Once enabled, the sense amplifiers initialized into the correct state. However, this required an inherent delay to assure reliable data, since an adequate differential had to first be developed between the bit lines before the amplifiers were activated. Thus, either of these methods resulted in less than an optimal design having minimal time delays.

It is desired to minimize the time to retrieve data from the cells of a memory array while maintaining data integrity.

SUMMARY OF THE INVENTION

It is therefore an object of the present invention to minimize the time required to retrieve data from storage cells of a memory array.

Another object is to precharge a sense amplifier to a first logic state and optimize the slew rate of the sense amplifier to this first logic state.

A memory sense system according to the present invention includes one or more asymmetrical sense amplifiers precharged to a first logic state and optimized to slew very fast towards the first logic state. Each sense amplifier is coupled to a corresponding pair of complementary bit lines, which are preferably precharged. When enabled, each sense amplifier tends towards an opposite, default logic state opposite the first logic state when sensing the precharged bit lines. Control and timing logic enables a corresponding precharge amplifier to precharge the bit lines, and then enables the sense amplifier after the assertion of a clock signal. Also, the control logic enables a corresponding pull-up device to precharge the output of each sense amplifier. Thus, the sense amplifier begins in the first, precharged logic state and slews towards the opposite, default logic state. The control logic then causes a word line select signal to be asserted, which causes a corresponding memory cell to drive a differential voltage on the bit lines to indicate a data bit. If the data bit supports the default state, then the sense amplifier switches fully to, or otherwise remains in, the default state and no further sensing is necessary. However, if the data bit supports the first, precharged state, the sense amplifier quickly responds and slews back to the first state. In this manner, since the sense amplifier is enabled first, it reaches the default state relatively early in the cycle so that the default state can be read faster. Furthermore, since the sense amplifier is asymmetrical and slews very fast towards the first logic state, it is able to recover back to the first state very quickly in response to the bit line differential. Thus, either logic state is achieved very quickly resulting in a very fast memory.

In the preferred embodiment, an array of data buffers are preferably provided to buffer the output data to an array of corresponding latches. The data buffers are preferably inverters which have an input switch point set to favor the default logic state of each sense amplifier. In this manner, the inverters switch relatively quickly in response to the sense amplifiers switching to the default state from the first logic state. The timing is controlled such that the sense amplifier reverses back to the first state while the invertor is switching. Although this may cause a slight glitch at the output of the invertor when the memory cell asserts a data bit corresponding to the first state, the invertor stabilizes back to the appropriate state very quickly.

In the preferred embodiment, the control logic enables an array of precharge amplifiers and pull-up devices to preliminarily charge all of the bit lines and the sense amplifier outputs. The control logic detects a transition of the external clock signal and disables the precharge amplifiers and pull-up devices. The control logic also asserts a sense enable signal for activating the sense amplifiers and then asserts a word line enable signal to initiate address decoding. After the decoding process, one of the word line sense signals is asserted causing the memory cells to assert data on the bit lines. A dummy timing path provides a self-timing signal to indicate to the control logic to turn off the sense amplifiers. The control logic detects the assertion of the timing signal and responds by asserting a latch signal to the output latches to latch the output data, and the control logic also deasserts the word line enable and sense enable signals to shut down the sense amplifiers and prevent further power drain in the memory array. The control logic also re-enables the precharge amplifiers and pull-up devices to prepare for the next memory access. In this manner, the output data is latched and the sense amplifiers are shut down as soon as possible to conserve energy, and the memory system is enabled for the next access. A more detailed description of the dummy timing path sense amplifier shutdown system is disclosed in commonly owned patent application U.S. Ser. No. 08/579,792, entitled "METHOD AND APPARATUS FOR A LOW POWER SELF-TIMED MEMORY CONTROL SYSTEM" by Robin Passow, Gordon W. Priebe, Ross MacTaggert, Ronald Isliefson, and Kevin LeClair, filed Dec. 28, 1995 and incorporated by reference herein for all purposes.

It is now appreciated that a memory system according to the present invention results in a very fast sensing scheme. The sense amplifiers are asymmetrical and optimized to slew in an opposite direction as a default state. Since activated early, the sense amplifiers stabilize into the appropriate state very quickly, resulting in a fast memory system.

Other and further objects, features and advantages will be apparent from the following description of presently preferred embodiments of the invention, given for the purpose of disclosure and taken in conjunction with the accompanying drawings.

DETAILED DESCRIPTION OF THE PREFERRED EMBODIMENT

Figure 1:
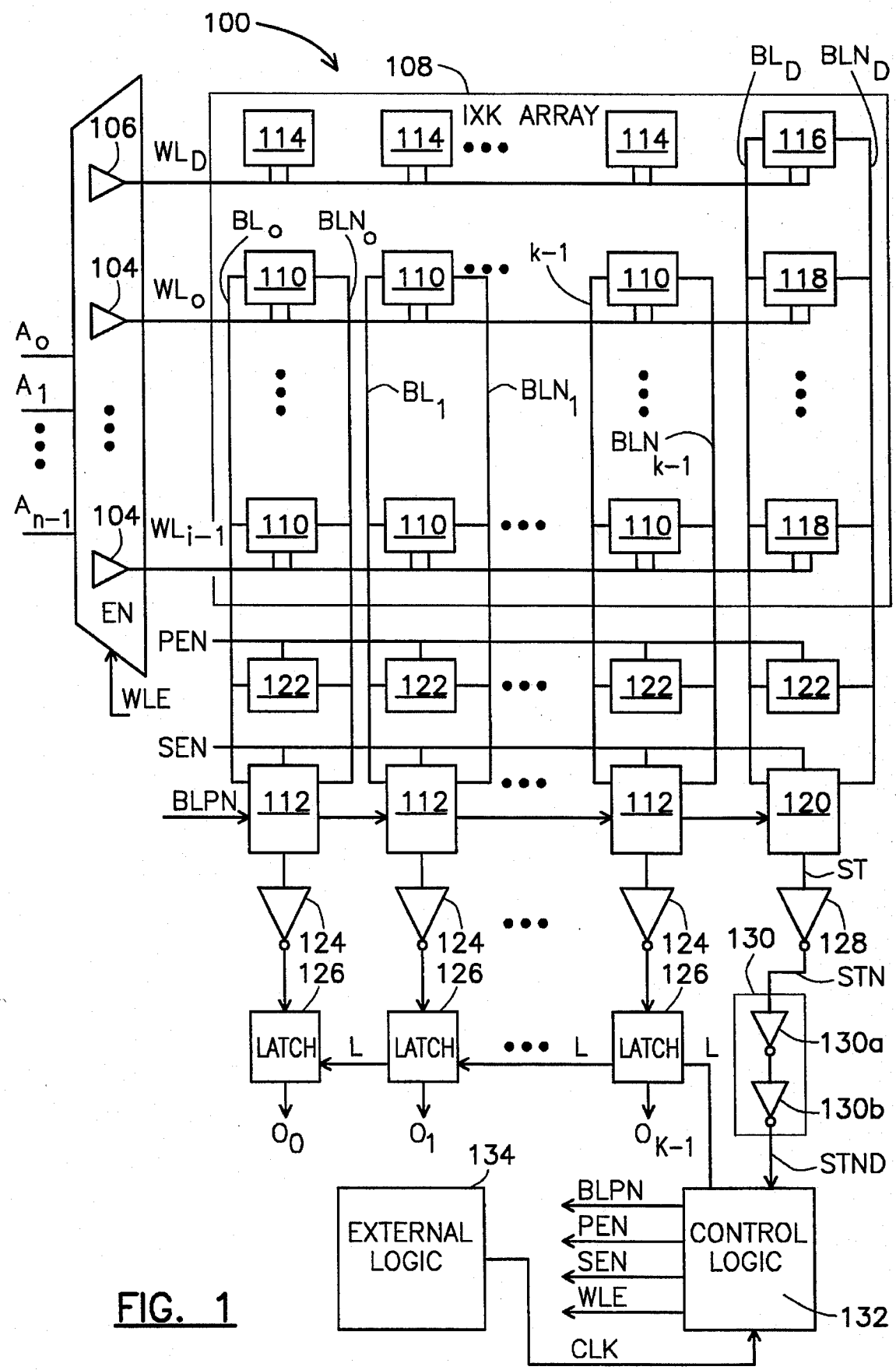
FIG. 1 is a simplified block diagram of a memory system according to the present invention.

Referring now to FIG. 1, a simplified block diagram is illustrated of a memory system 100 implemented according to the present invention. A plurality of address signals, $A_0$, $A_1, \ldots A_{n-1}$, collectively referred to as the ADDR signals, are provided to the input of a word line decoder 102 for asserting a plurality of word line signals, $WL_0$, $WL_1$, ... $WL_{i-1}$. A plurality of word line drivers 104 are included within the word line decoder 102 for asserting the respective word line signals $WL_0$- $WL_{i-1}$ on corresponding word line conductors. A word line enable (WLE) signal is asserted by control logic 132, described more fully below, where the word line decoder 102 decodes the ADDR signals to enable one of the drivers 104 to assert one of the $WL_0$- $WL_{i-1}$ signals in response.

The word line decoder 102 further includes a dummy word line driver 106, which asserts a dummy word line signal $WL_D$ on a dummy select line conductor during each memory access or read/write cycle in response to each assertion of the WLE signal. It is noted for clarity that reference to a bit "line" or word "line", such as the $WL_D$ word line, refers to a conductor or signal trace, whereas the corresponding signal, such as the $WL_D$ signal, refers to a signal asserted on that conductor. The $WL_0$- $WL_{i-1}$ and the $WL_D$ lines are all provided to a memory array 108. The memory array 108 primarily includes an i by k array or matrix of core memory cells 110 organized as a series of i rows and k columns as known to those skilled in the art. The particular number of rows and columns depends upon the size of the memory array 108. For example, typical memory sizes are 32 words by 4 bits up to 4096 words by 72 bits, although the present invention is not limited to any particular memory array size.

Each column of the array of core memory cells 110 is coupled to a corresponding pair of complementary bit lines for carrying bit line signals, referred to as $BL_j$ and $BLN_j$, which are further provided to a corresponding array of j sense amplifiers 112, where j is an integer from 0 to k-1. An "N" appended to the end of a signal name denotes negative or inverted logic. The $BL_j$ and $BLN_j$ complementary bit line signals are preferably initially precharged to a logic high voltage level, as described further below, where corresponding memory cells assert the particular data bit on the bit line signals by asserting one of the bit lines low. In particular, a logic 1 is represented as $BL_j$ remaining high and $BLN_j$ falling to a logic low level, and a logic 0 is represented by $BLN_j$ remaining high and the $BL_j$ signal falling to a logic low voltage level. Each of the sense amplifiers 112 preferably includes a differential amplifier for detecting the separation of the corresponding $BL_j$, $BLN_j$ bit line signals. In this manner, only one of the $WL_0$- $WL_{i-1}$ signals is asserted in response to assertion of the WLE signal and the corresponding row of memory cells 110 is enabled for asserting data on the $BL_j$, $BLN_j$ signals, where the $BL_j$, $BLN_j$ signals are asserted by only one core memory cell at any given time. Although not illustrated, a column address decoder may be provided to enable a subset of the core memory cells 110 in the enabled row.

The memory array 108 also includes a row of dummy memory cells 114 arranged along the top or upper row of the memory array 108, each coupled to the $WL_D$ line for receiving the $WL_D$ signal. The row of dummy memory cells further includes a fixed dummy memory cell 116 coupled to the $WL_D$ line, yet placed at the end of the row furthest from the dummy word line driver 106. The fixed memory cell 116 and the dummy memory cells 118 are all coupled to a corresponding pair of complementary dummy bit lines for carrying the $BL_D$, $BLN_D$ dummy bit line signals placed along the right-most column of the memory array 108, as illustrated in FIG. 1. The $BL_D$, $BLN_D$ signals are further coupled to a dummy sense amplifier 120 physically located in the lower right hand corner of the memory array 108, and is aligned in the same row as the core memory sense amplifiers 112.

During each memory access, the word line driver 106 asserts the $WL_D$ signal for enabling the fixed memory cell 116, which asserts the $BL_D$, $BLN_D$ signals to transmit a logic zero data bit to the dummy sense amplifier 120. Each of the dummy memory cells 114, 116, and 118 are implemented in substantially identical design and layout as each of the core memory cells 110. In this manner, the dummy path generally represents the longest path resulting in worst case timing of the memory array 108, which tracks or is otherwise proportional to the size of the memory array 108. Thus, the dummy path is the slowest path used to develop a self-timing signal, and is provided to the control logic 132 for determining when the current memory access is completed.

The memory array 108 also includes an array of precharge amplifiers 122, each coupled to a corresponding one of the BL and BLN bit lines, where BL, BLN collectively refers to the $BL_j$, $BLN_j$ and the $BL_D$, $BLN_D$ bit lines. Each precharge amplifier 122 receives a precharge enable (PEN) signal and responds charging a corresponding one of the BL, BLN signals high. Preferably, "precharging" denotes pulling the voltage of a signal line high to a source voltage level. In the preferred embodiment, the PEN signal is asserted low to enable the precharge amplifiers 122 when a master clock signal CLK is deasserted low. In this manner, prior to each access of the memory array 108, all of the BL, BLN bit line signals are precharged high. The PEN signal is then deasserted high prior to a memory access for allowing the corresponding memory cells 110 or 116 to assert corresponding data on the corresponding BL, BLN bit lines.

The respective outputs of the array of sense amplifiers 112 are provided to the respective inputs of an array of corresponding invertor-buffers 124, which have their outputs coupled to the respective inputs of an array of corresponding latches 126. The array of latches 126 asserts output signals $O_0, O_1, \ldots O_{k-1}$. Each of the latches 126 are preferably transparent when a latch signal L is deasserted low by the control logic 132, so that any data asserted by the corresponding inverters 124 is asserted on the output signals $O_0$- $O_{k-1}$. When the L signal is asserted, however, the latches 126 latch the data asserted by the inverters 124 to assert static output signals $O_0$- $O_{k-1}$.

The output of the dummy sense amplifier 120 asserts a self-timing signal ST, which is provided to the input of an invertor 128, which asserts an inverted self-timing signal STN. The STN signal is preferably provided to the input of a delay device 130, which asserts a delayed self-timing signal STND to the control logic 132. The delay device 130 is preferably implemented by a pair of series-coupled inverters 130a, 130b, which are each configured to provide any desired delay. The control logic 132 receives the CLK signal from external logic 134, which monitors the address signals ADDR and asserts the CLK signal when the ADDR signals are stabilized and access to the memory array 108 is desired. The control logic 132 responds by deasserting the PEN signal to disable the precharge amplifiers 122, and then asserts a signal SEN to enable the sense amplifiers 112 including the dummy sense amplifier 120. The control logic 132 also asserts the WLE signal to enable the word line decoder 102 to decode the ADDR signals. One of the word line drivers 104 asserts a corresponding word line enable signal and the word line driver 106 asserts the $WL_D$ signal.

The control logic 132 also asserts a bit line precharge signal (BLPN) low to each of the sense amplifiers 112 and 120 for precharging their outputs high before the CLK signal is asserted. The BLPN signal is also deasserted high when the CLK signal is asserted. Precharging in this case also means pulling the voltage of the outputs of the sense amplifiers to a source voltage level, which also corresponds to a logic high or logic one (1).

Operation of the memory system 100 is now described. In a default condition prior to a memory access while the CLK signal is deasserted, the control logic 132 asserts the PEN signal low to enable the precharge amplifiers 122 to precharge both of the BL, BLN signals for each column. The control logic 132 also asserts the BLPN signal low to precharge the outputs of the sense amplifiers 112 and 120 high. The STN and STND signals are both asserted low prior to each memory access. Further, the control logic 132 deasserts the SEN and WLE signals for disabling the sense amplifiers 112, 120 and the word line drivers 104, 106, respectively. The control logic 132 further deasserts the L signal so that the latches 126 are initially transparent.

The external logic 134 determines when the ADDR address signals have stabilized and correspondingly asserts a transition on the CLK signal. Such CLK transition may be low-to-high or high-to-low. The control logic 132 responds by deasserts the PEN signal so that the precharge amplifiers 122 release the BL, BLN signals for one or more of the core memory array columns and the dummy column. The control logic 132 also deasserts the BLPN signal high for releasing the outputs of the sense amplifiers 112 and 120. The control logic 132 asserts the SEN signal for enabling the sense amplifiers 112 and the dummy sense amplifier 120 for monitoring the corresponding data bits within the memory array 108. The control logic 132 also asserts the WLE signal for enabling the word line decoder 102 for decoding the ADDR address signals. In response, one of the word line drivers 104 asserts a corresponding $WL_0$- $WL_{i-1}$ signal, and the dummy word line driver 106 asserts the $WL_D$ signal.

In response to one of the $WL_0$- $WL_{i-1}$ signals being asserted, one or more of the core memory cells 110 in a corresponding row are enabled for asserting data on the corresponding $BL_j$, $BLN_j$ bit lines. The sense amplifiers 112 sense the corresponding data bits and assert data to the inverters 124, which assert inverted data to the array of latches 126. The latches 126 correspondingly assert the $O_0$- $O_{k-1}$ output data signals at their respective outputs, after any delay through the latches 126. Meanwhile, the dummy word line driver 106 asserts the $WL_D$ signal and the fixed memory cell 116 correspondingly asserts the $BL_D$ dummy bit line signal low after sensing the $WL_D$ signal asserted. The dummy sense amplifier 120 senses the $BL_D$, $BLN_D$ signals and correspondingly asserts the ST signal low in response to the logic zero read from the fixed memory cell 116. The invertor 128 correspondingly asserts the STN signal high and eventually the delay device 130 asserts the STND signal high, which is detected by the control logic 132.

In response to the STND signal being asserted high, the control logic 132 determines that the memory access has been completed and correspondingly asserts the L signal so that the array of latches 126 latch the $O_0$- $O_{k-1}$ output signals. The control logic 132 further deasserts the WLE and SEN signals to disable the word line decoder 102 and the sense amplifiers 112 and 120. The control logic 132 also re-asserts the PEN signal to the precharge amplifiers 122 to precharge all of the BL, BLN bit lines. The control logic 132 also asserts the BLPN signal low to precharge the outputs of the sense amplifiers 112 and 120 high. In this manner, once the STND signal is asserted high, the control logic 132 latches the data and places the memory array 108 back into a precharge state as soon as possible to prepare for the next memory access.

Figure 2:
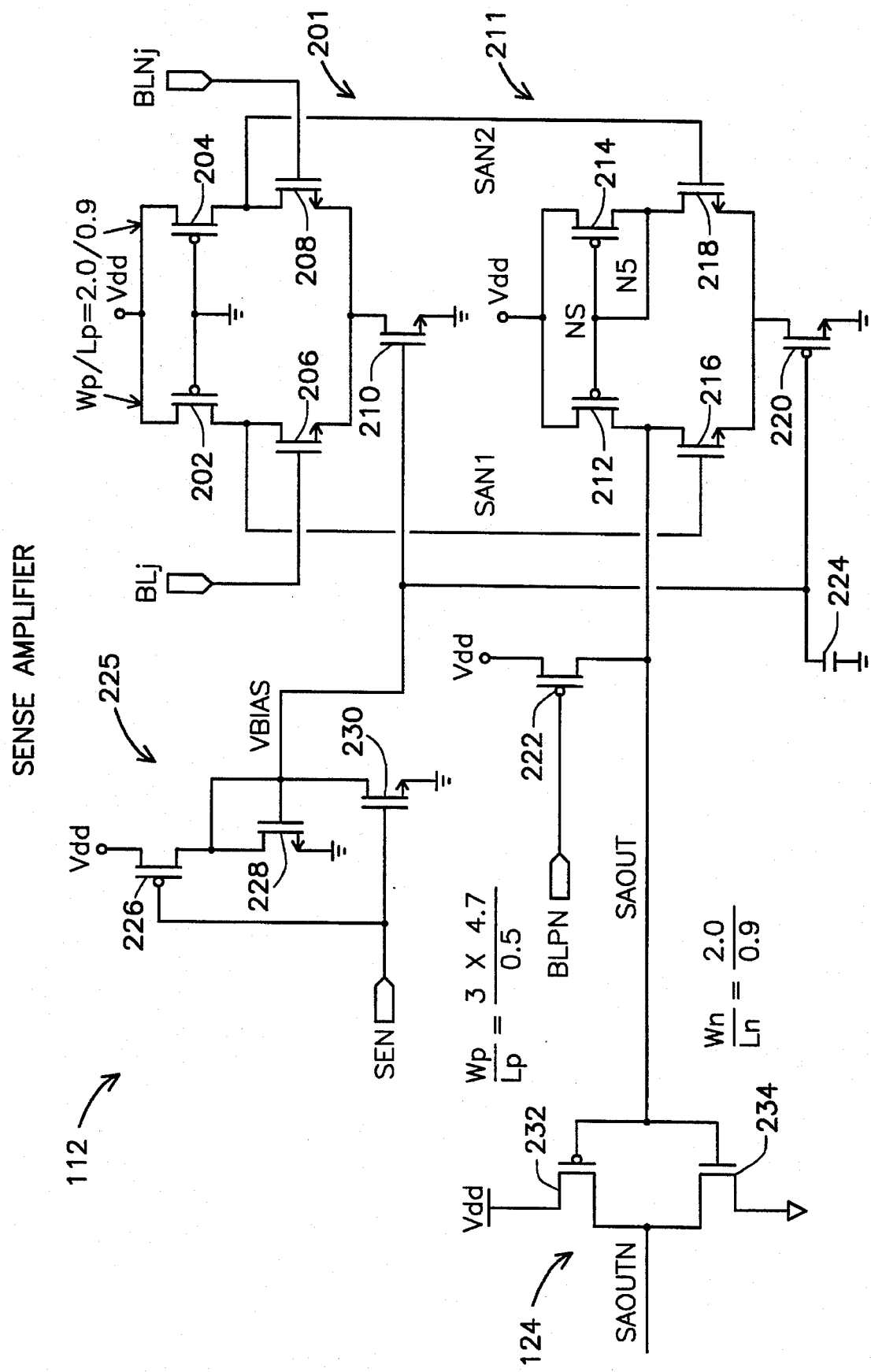
FIG. 2 is a schematic diagram of a memory sense amplifier coupled to an output buffer-invertor of FIG. 1.

Referring now to FIG. 2, a schematic diagram is illustrated of one of the core memory sense amplifiers 112 further connected to a corresponding invertor 124. Figure 2 illustrates the connection between each of the array of inverters 124 and the sense amplifiers 112 receiving the BL, BLN signals. The dummy path including the memory cells 114, 116, 118, the sense amplifier 120, the invertor 128 and the delay device 130 are provided for overall timing purposes and will not be further described.

The sense amplifier 112 preferably includes two stages, a level shifter stage 201 receiving the $BL_j$ and $BLN_j$ signals for asserting output signals SAN1 and SAN2, and a differential amplifier stage 211 receiving the SAN1 and SAN2 signals for asserting an output signal SAOUT. In the level shifter stage 201, the corresponding $BL_j$ signal is provided to the gate of an N-channel complementary metal-oxide semiconductor (CMOS) transistor 206, having its drain providing the SAN1 signal and its source connected to the drain of another N-channel CMOS transistor 2 10. The $BLN_j$ signal is provided to the gate of an N-channel CMOS transistor 208, having its drain providing the SAN2 signal and its source connected to the drain of the CMOS transistor 210. The source of the CMOS transistor 210 is connected to ground and receives a bias signal referred to as VBIAS. The VBIAS signal is developed by a separate bias circuit 225, described further below.

A source voltage signal, referred to as $V_{dd}$, is provided to the sources of two pull-up P-channel CMOS transistors 202 and 204, each having their gates connected to ground. The $V_{dd}$ signal is preferably 5 volts, but may also be 3 volts or even as low as 1.8 volts in the preferred embodiment. The drain of the CMOS transistor 202 is connected to the drain of the CMOS transistor 206 and the drain of the CMOS transistor 204 is connected to the drain of the CMOS transistor 208.

The SAN1 signal is provided to the gate of an N-channel CMOS transistor 216 within the differential amplifier stage 211. The drain of the CMOS transmitter 216 provides the SAOUT output signal of the sense amplifier 112. The source of the CMOS transistor 216 is provided to the drain of another N-channel CMOS transistor 220, having its source connected to ground and its gate receiving the VBIAS signal. A capacitor 224 is connected between the VBIAS signal and ground. The $V_{dd}$ signal is provided to the source of two pull-up P-channel CMOS transistors 212 and 214, where the drain of the CMOS transistor 212 is connected to the drain of the CMOS transistor 216, and where the drain of the CMOS transistor 214 is connected to the drain of the CMOS transistor 218 and also to both gates of the CMOS transistors 212 and 214. The gates of the CMOS transistors 212 and 214 are referred to as a node N5. The BLPN signal is provided to the gate of a P-channel CMOS transistor 222, having its source pulled high to the $V_{dd}$ signal and its drain connected to the SAOUT node for precharging the SAOUT signal where the BLPN signal is asserted low.

The SEN signal is provided to the gate of an N-channel CMOS transistor 230 and to the gate of a P-channel CMOS transistor 226 within the bias circuit 225. The source of the CMOS transistor 226 is pulled high to the $V_{dd}$ signal and its drain provides the VBIAS signal, which is provided to the drain and gate of another N-channel CMOS transistor 228 and to the drain of the CMOS transistor 230. The source of the CMOS transistor 228 is connected to ground.

The SAOUT signal is provided to the input of the invertor 124, which is implemented using a pull-up P-channel CMOS transistor 232 and a pull-down N-channel CMOS transistor 234. In particular, the SAOUT signal is provided to both gates of the CMOS transistors 232 and 234, both having their drains connected together for asserting an output signal SAOUTN. The source of the CMOS transistor 232 is pulled high to $V_{dd}$ and the source of the CMOS transistor 234 is connected to ground.

The general operation of the sense amplifier 112 is now described. The SEN signal is deasserted high for grounding the VBIAS signal through the CMOS transistor 230, which further turns off the CMOS transistors 210 and 220 to disable the sense amplifier 112. In the preliminary, precharged state, the BLPN signal is asserted low for turning on the CMOS transistor 222, which pulls the SAOUT signal high to the $V_{dd}$ signal precharging the output of the sense amplifier 112. Also while in the preliminary state, the $BL_j$, $BLN_j$ signals are both precharged high by a corresponding one of the precharge amplifiers 122, which turns on the CMOS transistors 206 and 208. In the preliminary state, the sense amplifier 112 consumes little, or no power since the CMOS transistors 210, 220 are turned off, thereby removing the path to ground. The SAN1 and SAN2 signals are both pulled high through the CMOS transistors 202, 204, respectively, thereby initially turning on the CMOS transistors 216, 218. However, the CMOS transistor 220 is off and the SAOUT signal is precharged high.

When the SEN signal is asserted low, the VBIAS signal is pulled high to a level determined by the ratio of drain-to-source resistances between the CMOS transistors 226 and 228, which turns on the CMOS transistors 210 and 220 to enable the sense amplifier 112. The BLPN signal is deasserted high so that the SAOUT signal is floated high. As the CMOS transistor 220 turns on, a path to ground develops through the CMOS transistors 216, 220 to begin pulling the SAOUT signal low. However, a conductive path also develops between the N5 node and ground through the CMOS transistors 218, 220, which tends to turn on the CMOS transistors 212, 214 thereby somewhat offsetting the drop of the SAOUT signal. Also, since the $BL_j$ and $BLN_j$ bit line signals are precharged high and as the CMOS transistor 210 is turned on, the SAN1 and SAN2 signals begin dropping turning off the CMOS transistors 216, 218, respectively.

The result of this initial complex dynamic is that the SAOUT signal begins to fall in response to the BLPN being deasserted and the SEN signal being asserted, but the SAOUT signal does not fall at the fastest possible rate. Nonetheless, the SAOUT signal falls enough to reach the switch-point of the invertor 124 fairly quickly, especially since the input switch-point of the invertor 124 is biased at a relatively high voltage level, as described further below. In this manner, although the output of the sense amplifier 112 is precharged high, its output has a default state of a logic low or zero and begins falling low in response to being enabled.

As described further below, the timing of the control logic 132 is configured so that the corresponding memory cell 110 is enabled after the sense amplifier 112 is enabled and is switching to its default logic state. If the corresponding core memory cell 110 asserts a zero on the $BL_j$, $BLN_j$ bit line signals, then the $BL_j$ signal begins to drop. This correspondingly turns off the CMOS transistor 206, pulling the SAN1 signal above the SAN2 signal. The CMOS transistor 216 turns fully on, thereby grounding the SAOUT signal to a logic low level through the transistors 216 and 220. In this manner, if the $BL_j$ signal is pulled low indicating a logic 0, the SAOUT signal falls to a low voltage level to assert a logic 0, thereby reinforcing the default state.

On the other hand, if the corresponding core memory cell 110 asserts a logic 1, then the voltage of $BLN_j$ signal is asserted low, turning off the CMOS transistor 208. The SAN2 signal increases relative to the SAN1 signal, thereby turning on the CMOS transistor 218. Meanwhile, the CMOS transistor 216 is turned off, removing the ground path affecting the SAOUT signal. The voltage of the N5 node is pulled low, thereby turning on the CMOS transistor 212, pulling the SAOUT signal high through the $V_{dd}$ signal. All of these factors combined cause the sense amplifier 112 to respond very quickly to the $BLN_j$ signal dropping low. In fact, the SAOUT signal reverses very quickly and goes back high to the precharged high state. Thus, the $BLN_j$ signal being asserted low to indicate a logic 1 causes the SAOUT signal to reverse and go back high very quickly after the memory cell 110 is enabled.

This characteristic reflects the asymmetry of the sense amplifier 112 in that it slews very quickly from low-to-high relative to the high-to-low transition. It is noted, however, that the logic polarity could be reversed where the sense amplifier 112 would be designed to slew quickly from high-to-low. The present invention is not limited to any particular logic polarity.

The invertor 124 is preferably biased to have a relatively high voltage switching point at its input, so that its output favors a high logic level. The width-to-length ratio $(W_p/L_p)$ of the P-channel CMOS transistors 232 is set to 3×4.7/0.5, so that its drain-to-source resistance is relatively small compared to the N-channel CMOS transistor 234, which has its width-to-length ratio $(W_N/L_N)$ ratio equal to 2.0/0.9. The SAOUTN signal is initially asserted low since the SAOUT signal is precharged high. As the SAOUT signal begins to fall, it quickly reaches the relatively high switch-point of the invertor 124 since the CMOS transistor 232 turns on faster than the CMOS transistor 234 turns off. Thus, the SAOUTN signal rises relatively quickly in response to the SAOUT signal falling. It is further noted that, although the SAOUT signal begins to fall and possibly switches the invertor 124, the $BLN_j$ signal falling low in response to reading a logic 1 causes the SAOUT signal to reverse and go back high, thereby re-switching the invertor 124. Although this may cause an output glitch of the invertor 124, the glitch is easily minimized by slight tinning adjustments. It is desired to keep this glitch as small as possible over all temperature and voltage operating ranges.

In summary, the sense amplifier 112 is precharged high but begins to settle to a default low state when enabled in response to the bit lines both being precharged high. An output invertor 124 is biased to toggle early, where the sense amplifier 112 preferably reaches this switch-point about when the bit lines begin separating. The memory cell 110 is then enabled to begin asserting the bit lines while the sense amplifier 112 is switching. If the memory cell 110 asserts a logic low reinforcing the default state, sensing is effectively completed very early where the invertor 124 is already asserting the correct output state. If the memory cell 110 asserts the opposite state, the sense amplifier 112 reverses very quickly due to its asymmetrical configuration and asserts the first, or precharged state before the bit lines finish separating. In this manner, sensing is completed very quickly in either case.

Figure 3A:
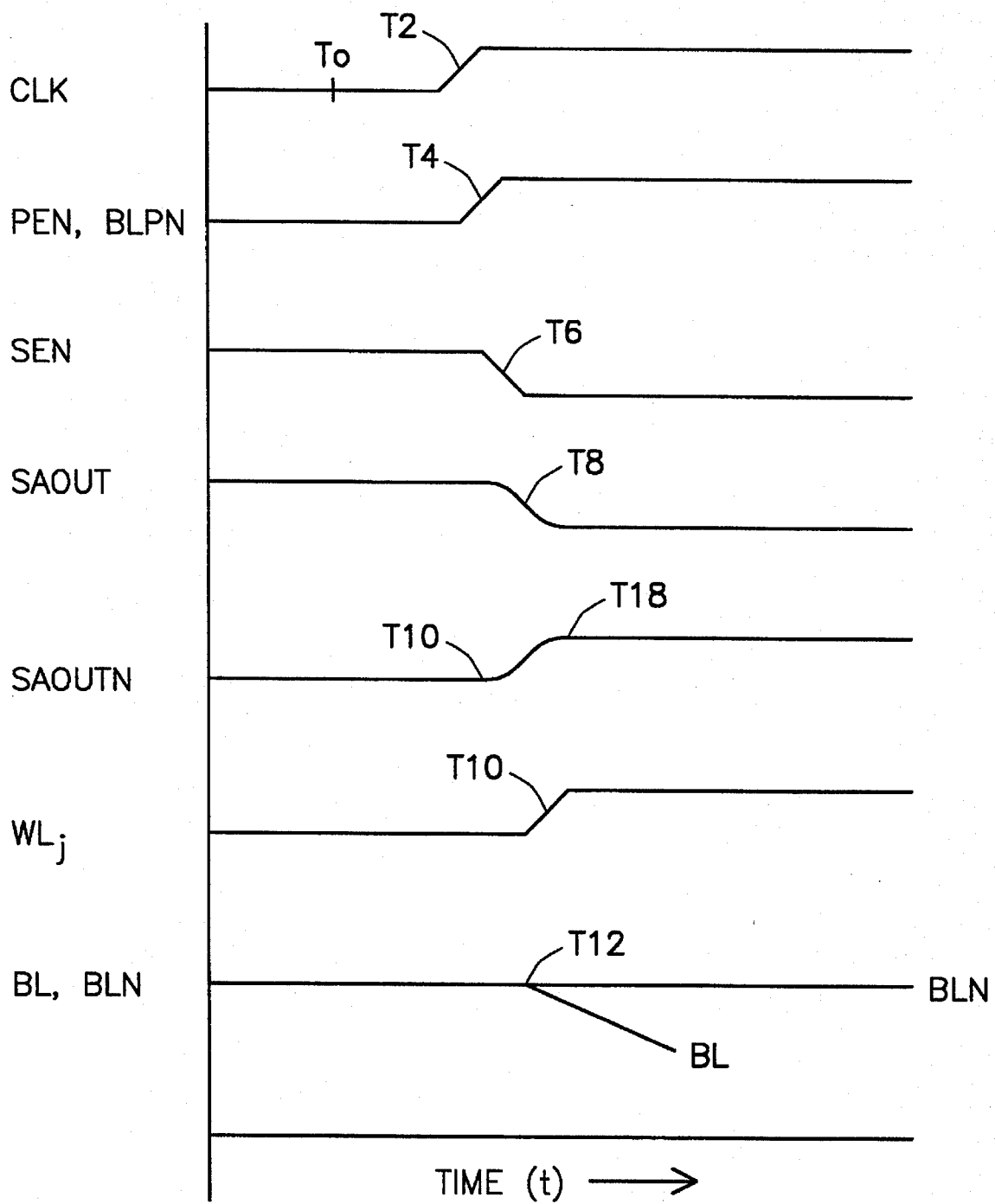
FIG. 3 is a timing diagram illustrating operation of the memory system and sense amplifier of FIGS. 1 and 2.
Figure 3B:
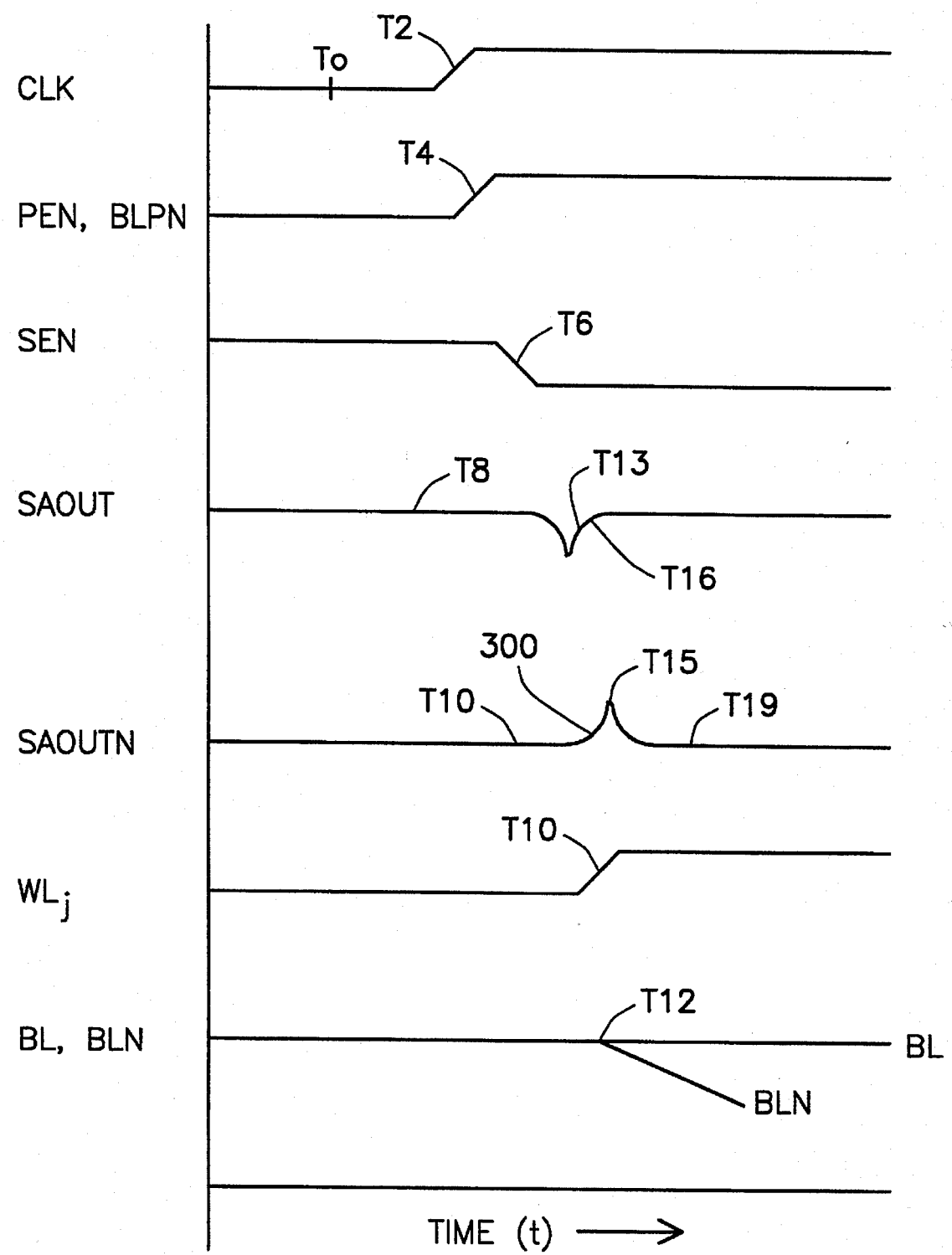

FIGS. 3A and 3B are timing diagrams illustrating operation of the memory system 100 and each of the sense amplifiers 112 for both the read 0 and read 1 cases, respectively. Referring first to FIG. 3A, the CLK signal is deasserted low at an initial time T0, so that the control logic 132 asserts the PEN and BLPN signals low to precharge the BL, BLN signals high and to precharge the SAOUT signal high. The SAOUTN signal is initially asserted low by the invertor 124. Also, the control logic deasserts the WLE and SEN signals initially low. A corresponding $WL_i$ word line select signal is illustrated in the timing diagram rather than the WLE signal. The memory array 108 is thus precharged and ready for a memory access.

The external logic 134 monitors the ADDR signals and other control signals (not illustrated) for determining when a memory access is desired. After the ADDR address signals are stabilized, the external logic 134 asserts the CLK signal at time T2 to initiate a memory access. In the embodiment illustrated, the memory access is a memory read cycle for retrieving data from the memory array 108 through the $O_0$-$O_{k-1}$ output signals.

In response to the assertion of the CLK signal, the control logic deasserts the PEN and BLPN signals at a time T4 to release the precharge amplifiers 122 and the sense amplifiers 112. The control logic 132 then asserts the SEN signal at time T6. The control logic 132 also asserts the WLE signal, which enables the word line decoder 102, where a corresponding driver 104 asserts the $WL_i$ signal. It is desired that the sense amplifier 112 be enabled and start switching to its default state before the $WL_i$ signal is asserted enabling the corresponding memory cell 110. Thus, the decoding time in the word line decoder 102 is either known and fixed or strictly controlled to assure the desired timing relationship between the SEN and $WL_i$ signals. The SEN signal enables the sense amplifier 112, which begins asserting the SAOUT signal low at a time T8 to thereby switch to its default low state. Due to the relatively high voltage switch-point of the invertor 124, the invertor 124 begins asserting the SAOUTN signal high relatively quickly at a time T10.

At about the same time as time T10, the $WL_i$ signal is asserted thereby enabling the corresponding memory cell 110. In the preferred embodiment, the SEN signal preferably leads the $WL_i$ signal by about 0.5–1.0 nanoseconds (ns), preferably closer to 0.5 ns. The BL, BLN signals begin separating at about time T12, soon after the memory cell 110 is enabled. In this case, the memory cell 110 asserts a zero data bit, so that the BL signal is asserted low while the BLN signal remains asserted high. Since the assertion of the BL signal low reinforces the default state of the sense amplifier, the SAOUTN signal is fully asserted high at approximately time T18 to complete the sensing function. This is relatively early in the cycle, since the BL, BLN bit lines have not separated very far at all before sensing is completed.

Referring now to FIG. 3B, the read logic one timing diagram is illustrated. Operation is similar to the read logic zero case up to time T10, where the SAOUTN and the $WL_i$ signals are starting to go high while the SAOUT signal is falling to its default state. The BL, BLN bit lines begin separating at time T12, except that the BLN signal is asserted low by the memory cell 110 in this case for a read one. At about time T13, prior to time T18 in the cycle relative to FIG. 3A, the sense amplifier 112 detects the BLN signal being asserted low and very quickly responds by asserting the SAOUT signal back high. Since the slew rate of the sense amplifier 112 is optimized for the low-to-high transition, the SAOUT signal is fully asserted high at approximately a time T16.

Meanwhile, the SAOUT signal very quickly reaches the switch-point of the invertor 124 at approximately time T15, prior to time T16. The invertor 124 responds at time T15 and begins reversing to assert its output back low. The invertor 124 asserts the SAOUTN signal fully low at time T19, which is relatively soon after the time T18. Time T19 occurs well before the BL, BLN signals fully separate. Thus, the sense operation is completed very quickly in response to the read one case. It is noted that an output glitch 300 may occur at the output of the invertor 124. The timing between the SEN and $WL_i$ signals can be optimized to reduce the glitch 300 to a minimum level. Nonetheless, the glitch 300 is relatively inconsequential since the data is retrieved or otherwise latched after time T19 when the glitch 300 has dissipated. As previously stated, the timing is easily adjusted to minimize the duration and size of the glitch 300 over all temperature and voltage operating ranges.

It is now appreciated that a memory sensing system according to the present invention is very fast compared to prior art schemes. Each sense amplifier is precharged in a first state and biased asymmetrically to slew towards the first state very quickly. The bit lines are precharged to cause the sense amplifier to fall to an opposite, default state when enabled early. The memory cell is thus enabled at the appropriate time to cause voltage separation of the bit lines. If the bit lines separate to reinforce the default state, the sensing is completed very early in the cycle. If the bit lines separate to support the first state, the sense amplifier recovers very quickly due to its optimized slew rate, so that sensing is once again completed very early in the cycle. An output invertor is preferably added having its input biased to support the default state. Thus, the invertor switches quickly in the cycle. The invertor recovers very quickly, however, in response to the sense amplifier slewing back to the first, precharged state. In particular embodiments with access times on the order of 3–4 ns or about 3.5 ns, the present invention decreases the sensing time by approximately 0.5 ns, or at least 0.4 ns.

The present invention, therefore, is well adapted to carry out the objects and attain the ends and advantages mentioned, as well as others inherent therein. While a presently preferred embodiment of the invention and various aspects thereto has been given for purposes of disclosure, numerous changes in the details of construction, interconnection and arrangement has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

What is claimed is:

1. A fast sensing system for retrieving a data bit from a memory cell which asserts a voltage differential representing the data bit on complementary bit lines in response to a word line enable signal, said sensing system comprising:

a precharge amplifier for precharging both of the complementary bit lines;

a sense amplifier for coupling to the complementary bit lines to sense the voltage differential when enabled and for asserting a corresponding output signal, said sense amplifier being biased to switch to a default logic state in response to both of the bit lines being precharged, said sense amplifier being configured to have a fast slew rate when switching to an opposite logic state from said default logic state in response to sensing the voltage differential indicating said opposite logic state; and control logic coupled to said precharge amplifier and said sense amplifier and receiving a dock signal and for asserting the word line enable signal, wherein said control logic enables said precharge amplifier and disables said sense amplifier and deasserts the word line enable signal while said clock signal is deasserted, and wherein in response to said clock signal being asserted, said control logic first disables said precharge amplifier and enables said sense amplifier to begin sensing said precharged bit lines, and then asserts the word line enable signal to enable the memory cell to assert the voltage differential on said bit lines while said sense amplifier is switching to said default logic state;

wherein said sense amplifier remains in said default logic state if the data bit indicates said default logic state and switches to said opposite logic state if the data bit indicates said opposite logic state.

2. The sensing system of claim 1, further comprising:

a pull-up device coupled to said sense amplifier for precharging said output signal of said sense amplifier;

wherein said control logic is coupled to said pull-up device to enable said pull-up device to precharge said output signal of said sense amplifier while said clock signal is deasserted, and to disable said precharge device in response to said clock signal being asserted.

3. The sensing system of claim 2, further comprising a buffer having an input for receiving said output signal of said sense amplifier, wherein said input is biased toward said default logic state.

4. The sensing system of claim 3, wherein said buffer comprises an invertor, wherein said invertor toggles in response to said sense amplifier switching to said default state alter being enabled, and toggles again if the differential voltage indicates said opposite logic state.

5. The sensing system of claim 4, wherein said precharge amplifier precharges both of the complementary bit lines to a high voltage level, wherein said pull-up device pulls said output signal of said sense amplifier to the high voltage level, and wherein the switch-point of said input of said invertor is biased toward the high voltage level.

6. The sensing system of claim 5, wherein the complementary pair of bit lines includes a positive bit line and a negative bit line, and wherein the memory cell asserts said positive bit line low to indicate a logic zero and asserts said negative bit line low to indicate a logic one.

7. The sensing system of claim 6, wherein said default logic state is a logic zero and wherein said opposite logic state is a logic one.

8. A fast memory system, comprising:

a precharge amplifier for precharging a pair of complementary bit lines;

a memory cell coupled to said bit lines for asserting a voltage differential representing a data bit on said bit lines when said memory cell is enabled;

a sense amplifier coupled to said bit lines for sensing said voltage differential when enabled and for asserting an output signal, said sense amplifier being biased to switch to a default logic state in response to both of said bit lines being precharged, said sense amplifier further having a fast slew rate when switching to an opposite logic state of said default logic state in response to sensing said voltage differential indicating said opposite logic state; and control logic coupled to said precharge amplifier, said sense amplifier and said memory cell and for receiving a clock signal, wherein said control logic enables said precharge amplifier and disables said sense amplifier and said memory cell while said clock signal is deasserted, and wherein in response to said clock signal being asserted, said control logic first disables said precharge amplifier and enables said sense amplifier to begin sensing said precharged bit lines, and then enables said memory cell to assert said voltage differential on said bit lines while said sense amplifier is switching to said default logic state;

wherein said sense amplifier remains in said default logic state if said data bit indicates said default logic state and switches to said opposite logic state very quickly if said data bit indicates said opposite logic state.

9. The memory system of claim 8, further comprising:

a pull-up device coupled to said sense amplifier for precharging said output signal;

wherein said control logic is coupled to said pull-up device to enable said pull-up device to precharge said output signal while said clock signal is deasserted, and to disable said pull-up device after said clock signal is asserted.

10. The memory system of claim 9, further comprising a buffer having an input receiving said output signal, said input of said buffer biased toward said default logic state.

11. The memory system of claim 10, wherein said buffer comprises an invertor, wherein said invertor toggles in response to said sense amplifier switching to said default state are being enabled, and toggles again if said differential voltage indicates said opposite logic state.

12. The memory system of claim 11, wherein said precharge amplifier precharges both of said complementary bit lines to a logic high voltage level.

13. The memory system of claim 12, wherein said complementary pair of bit lines includes a positive bit line and a negative bit line, and wherein said memory cell asserts said positive bit line low to indicate a logic zero and asserts said negative bit line low to indicate a logic one.

14. The memory system of claim 13, wherein said default logic state is a logic zero and wherein said opposite logic state is a logic one.

15. A memory system, comprising:

an array of precharge amplifiers, each for precharging a corresponding pair of complementary bit lines;

an array of memory cells, each coupled to a corresponding pair of said bit lines for asserting a voltage differential representing a data bit on said corresponding bit lines when said memory cell is enabled;

an array of sense amplifiers, each coupled to a corresponding pair of said bit lines for sensing said voltage differential when enabled and for asserting a corresponding output signal, said sense amplifier being biased to switch to a default logic state in response to both of said bit lines being precharged, each of said sense amplifiers further having a fast slew rate when switching to an opposite logic state of said default logic state in response to sensing said voltage differential indicating said opposite logic state; and control logic coupled to said array of precharge amplifiers, said array of sense amplifiers and said array of memory cells and for receiving a clock signal, wherein said control logic enables said precharge amplifiers and disables said sense amplifiers and said memory cells while said clock signal is deasserted, and wherein in response to said clock signal being asserted, said control logic first disables said precharge amplifiers and enables said sense amplifiers to begin sensing corresponding ones of said bit lines, and then enables said memory cells to assert a voltage differential on said corresponding bit lines while said sense amplifiers are switching to said default logic state;

wherein each of said sense amplifiers remains in said default logic state if a corresponding data bit indicates said default logic state and switches to said opposite logic state if said corresponding data bit indicates said opposite logic state.

16. The memory system of claim 15, further comprising:

an array of pull-up devices, each coupled to a corresponding one of said array of sense amplifiers for precharging said output signal;

wherein said control logic is coupled to each of said pull-up devices to enable said pull-up device to precharge corresponding output signals while said clock signal is deasserted, and to disable said pull-up device after said clock signal is asserted.

17. The memory system of claim 16, further comprising an array of inverters, each having an input receiving a corresponding output signal, said input biased to favor said default logic state.

18. The memory system of claim 17, wherein said array of precharge amplifiers precharges all of the complementary bit lines to a high voltage level, wherein said array of pull-up devices pull all of said output signals to the high voltage level, and wherein the switch-point of said input of each of said array of inverters is biased toward the high voltage level.

19. The memory system of claim 15, wherein said control logic includes a word line decoder for asserting one of a plurality of word line enable signals to enable a corresponding row of said array of memory cells.

20. The memory system of claim 15, wherein said array of memory cells includes a dummy path for developing a self-timing signal, and wherein said control logic detects said self-timing signal to indicate the end of the memory access.

21. A method for fast reading a memory system, comprising the steps of:

precharging a pair of complementary bit lines with a precharge amplifier;

asserting a voltage differential representing a data bit on said bit lines when said memory cell is enabled from a memory cell coupled to said bit lines;

sensing said voltage differential with a sense amplifier coupled to said bit lines, said sense amplifier asserting an output signal when enabled, said sense amplifier being biased to switch to a default logic state in response to both of said bit lines being prechaged, said sense amplifier further having a fast slew rate when switching to an opposite logic state of said default logic state in response to sensing said voltage differential indicating said opposite logic state; and receiving a clock signal by a control logic that is coupled to said precharge amplifier, said sense amplifier and said memory cell, wherein said control logic enables said precharge amplifier and disables said sense amplifier and said memory cell while said clock signal is deasserted, and wherein in response to said clock signal being asserted, said control logic first disables said precharge amplifier and enables said sense amplifier to begin sensing said precharged bit lines, and then enables said memory cell to assert said voltage differential on said bit lines while said sense amplifier is switching to said default logic state;

wherein said sense amplifier remains in said default logic state if said data bit indicates said default logic state and switches to said opposite logic state very quickly if said data bit indicates said opposite logic state.

22. The method of claim 21, further comprising the step of coupling a pull-up device to said sense amplifier for precharging said output signal, wherein said control logic is coupled to said pull-up device to enable said pull-up device to precharge said output signal while said clock signal is deasserted, and to disable said pull-up device after said clock signal is asserted.

23. The method of claim 22, further comprising the step of biasing a buffer toward said default logic state, said buffer having an input receiving said output signal.

24. The method of claim 23, wherein said buffer comprises an invertor, wherein said invertor toggles in response to said sense amplifier switching to said default state after being enabled, and toggles again if said differential voltage indicates said opposite logic state.

25. The method of claim 24, wherein said precharge amplifier precharges both of said complementary bit lines to a logic high voltage level.

26. The method of claim 25, wherein said complementary pair of bit lines includes a positive bit line and a negative bit line, and wherein said memory cell asserts said positive bit line low to indicate a logic zero and asserts said negative bit line low to indicate a logic one.

27. The method of claim 26, wherein said default logic state is a logic zero and wherein said opposite logic state is a logic one.

* * * * *